United States Patent
Xing

(10) Patent No.: US 10,546,631 B1
(45) Date of Patent: Jan. 28, 2020

(54) STATIC RANDOM ACCESS MEMORY CELL STRUCTURE

(71) Applicant: UNITED MICROELECTRONICS CORP., Hsin-Chu (TW)

(72) Inventor: Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/208,523

(22) Filed: Dec. 3, 2018

(30) Foreign Application Priority Data

Oct. 31, 2018 (CN) .......................... 2018 1 1283973

(51) Int. Cl.
*G11C 11/412* (2006.01)
*H01L 27/11* (2006.01)
*G11C 11/419* (2006.01)

(52) U.S. Cl.
CPC .......... *G11C 11/412* (2013.01); *G11C 11/419* (2013.01); *H01L 27/1104* (2013.01)

(58) Field of Classification Search
CPC .............................. G11C 11/412; G11C 11/41
See application file for complete search history.

(56) References Cited

U.S. PATENT DOCUMENTS

| | | | |
|---|---|---|---|
| 6,044,011 A * | 3/2000 | Marr | G11C 11/412 257/351 |
| 6,828,632 B2 | 12/2004 | Bhattacharyya | |
| 7,400,524 B2 | 7/2008 | Otsuka | |
| 7,651,905 B2 * | 1/2010 | Kapoor | G11C 11/412 257/202 |

OTHER PUBLICATIONS

He, Title of Invention: Semiconductor Device , U.S. Appl. No. 15/871,920 , filed Jan. 15, 2018.
Verma, Title of Invention: Semiconductor Device and Manufacturing Method Thereof, U.S. Appl. No. 15/928,105, filed Mar. 22, 2018.

* cited by examiner

*Primary Examiner* — Allison Bernstein
(74) *Attorney, Agent, or Firm* — Winston Hsu

(57) ABSTRACT

A static random access memory (SRAM) cell structure includes a first inverter. The first inverter includes a first transistor and a second transistor. The first transistor includes a first source electrode and a first drain electrode. The first source electrode is connected to a first voltage source. The first source electrode includes a first doped region and a second doped region disposed in the first doped region, and a conductivity type of the second doped region is complementary to a conductivity type of the first doped region. The first drain electrode is connected to a first storage node. The second transistor includes a second source electrode and a second drain electrode. The second source electrode is connected to a second voltage source. The second drain electrode is connected to the first storage node.

20 Claims, 8 Drawing Sheets

US 10,546,631 B1

STATIC RANDOM ACCESS MEMORY CELL STRUCTURE

BACKGROUND OF THE INVENTION

1. Field of the Invention

The present invention relates to a memory cell structure, and more particularly, to a static random access memory (SRAM) cell structure.

2. Description of the Prior Art

In the semiconductor manufacturing related field, the size of functional devices in the integrated circuits becomes smaller continuously for enhancing the performance of the chip. In the semiconductor device using a silicon on insulator (SOI) substrate, the body region will be electrically floating without body-tied design, and the electrical performance and the reliability of the semiconductor device may be negatively influenced by the floating body effect. However, the region occupied by the semiconductor device with normal body-tied design may become relatively larger, and that will hinder the development of scaling down and the enhancement of integration.

SUMMARY OF THE INVENTION

A static random access memory (SRAM) cell structure is provided in the present invention. A first doped region and a second doped region having a conductivity type complementary to a conductivity type of the first doped region are disposed in a first source electrode connected to a first voltage source for forming a charge release path. Accordingly, the negative impact of the floating body effect on the electrical performance and the reliability of the SRAM cell structure may be improved without increasing the area occupied by the SRAM cell structure.

According to an embodiment of the present invention, an SRAM cell structure is provided. The SRAM cell structure includes a first inverter. The first inverter includes a first transistor and a second transistor. The first transistor includes a first source electrode and a first drain electrode. The first source electrode is connected to a first voltage source. The first source electrode includes a first doped region and a second doped region. The second doped region is disposed in the first doped region, and a conductivity type of the second doped region is complementary to a conductivity type of the first doped region. The first drain electrode is connected to a first storage node. The second transistor includes a second source electrode and a second drain electrode. The second source electrode is connected to a second voltage source. The second drain electrode is connected to the first storage node.

According to another embodiment of the present invention, an SRAM cell structure is provided. The SRAM cell structure includes a first inverter. The first inverter includes a first transistor and a second transistor. The first transistor includes a first source electrode and a first drain electrode. The first source electrode is connected to a first voltage source. The first source electrode includes a first doped region and a second doped region. The second doped region is disposed in the first doped region, and a conductivity type of the second doped region is complementary to a conductivity type of the first doped region. The second doped region divides the first doped region into two separated parts disposed at two opposite sides of the second doped region respectively. The first drain electrode is connected to a first storage node. The second transistor includes a second source electrode and a second drain electrode. The second source electrode is connected to a second voltage source. The second drain electrode is connected to the first storage node.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 and FIG. 6 are schematic drawings illustrating a manufacturing method of the SRAM cell structure according to the first embodiment of the present invention, wherein FIG. 6 is a schematic drawing in a step subsequent to FIG. 5.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Additionally, terms, such as "bottom", "below", "above", "top", and the like, may be used herein for ease of description to describe one element or feature's relationship to another element(s) or feature(s) as illustrated in the figures. If the device in the figures in turned over, elements described as "above" can become "below". It will be understood that spatially relative terms are intended to encompass different orientations of the device in use or operation in addition to the orientations depicted in the figures The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
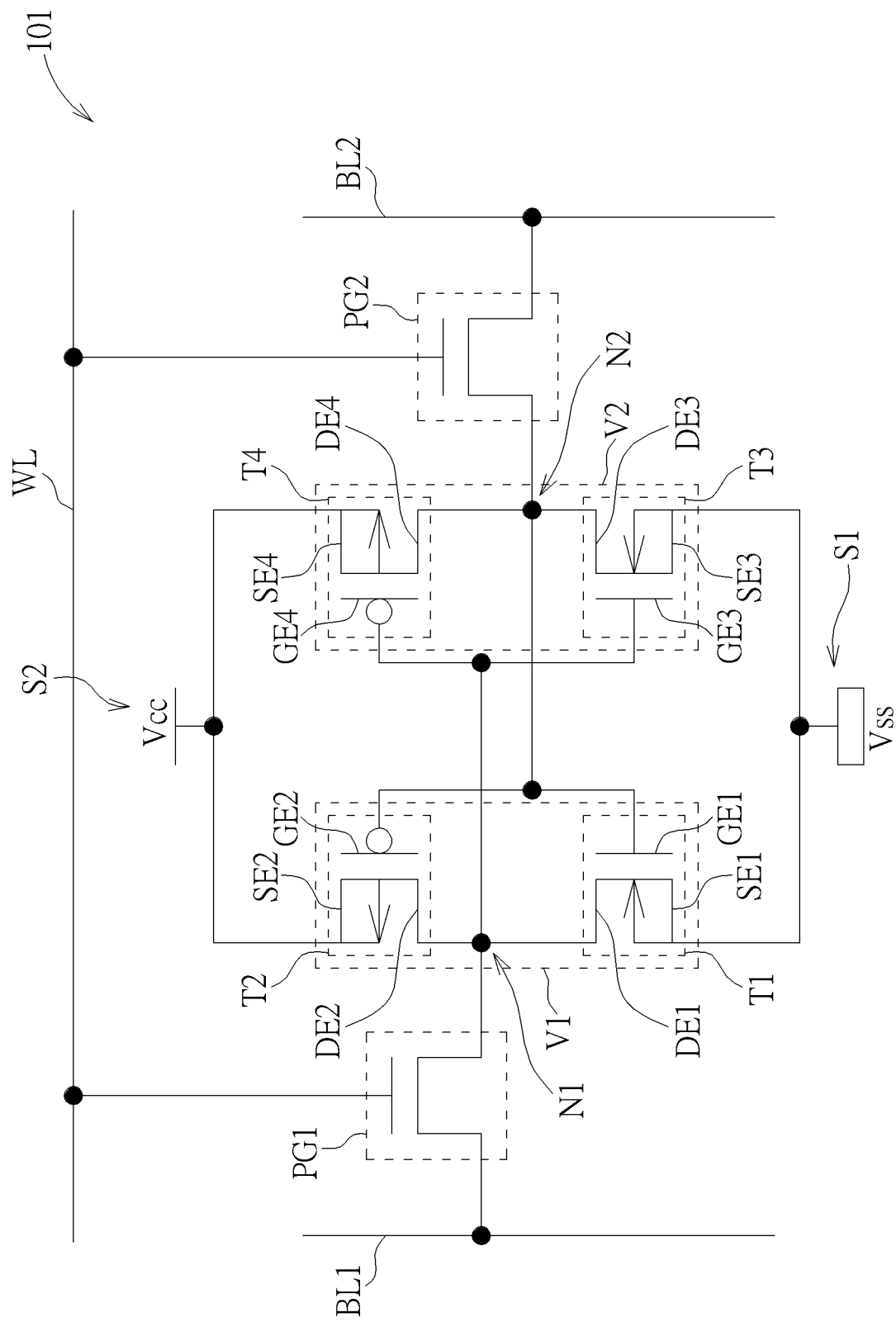
FIG. 1 is a schematic circuit diagram of a static random access memory (SRAM) cell structure according to a first embodiment of the present invention.
Figure 2:
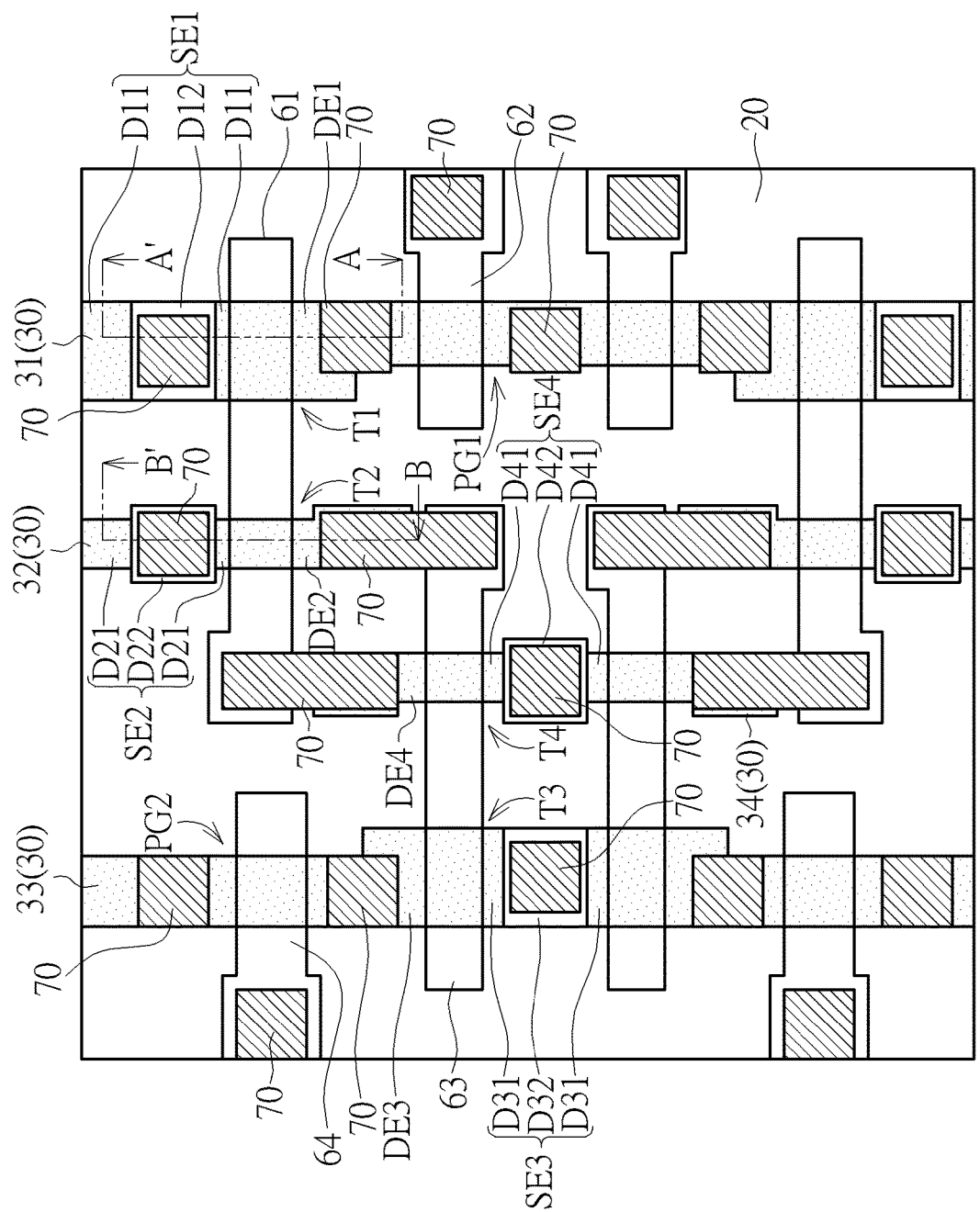
FIG. 2 is a schematic top view diagram of the SRAM cell structure according to the first embodiment of the present invention.
Figure 3:
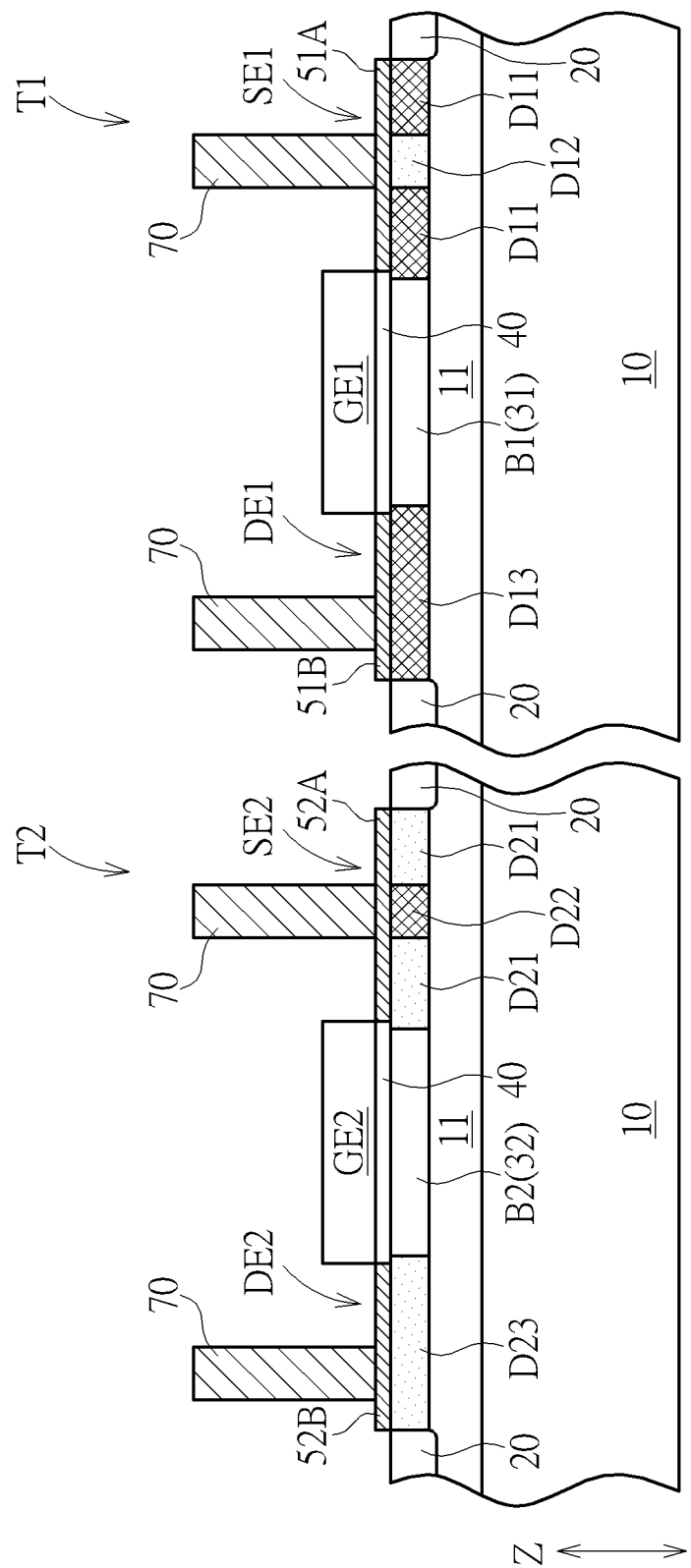
FIG. 3 is a schematic cross-sectional diagram of a first transistor and a second transistor in the SRAM cell structure according to the first embodiment of the present invention.
Figure 4:
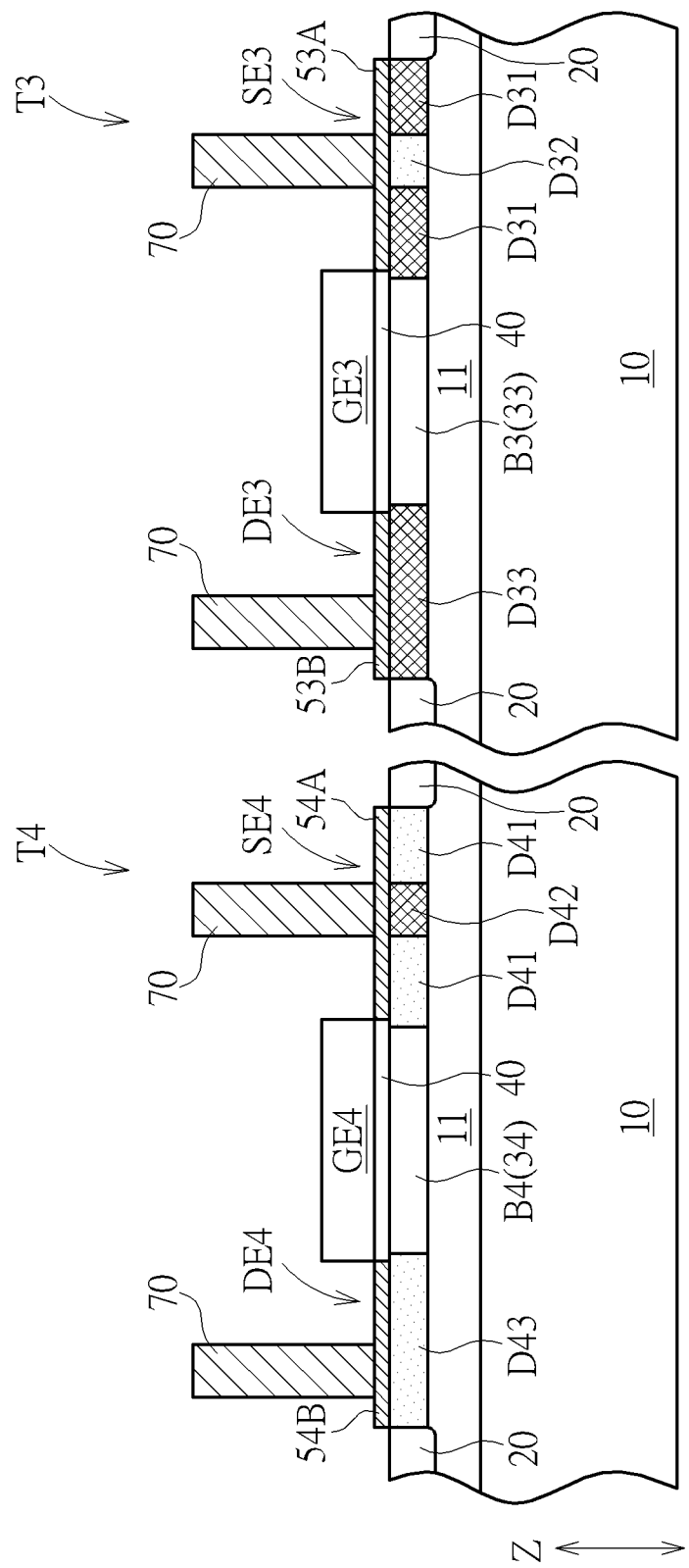
FIG. 4 is a schematic cross-sectional diagram of a third transistor and a fourth transistor in the SRAM cell structure according to the first embodiment of the present invention.

Please refer to FIGS. 1-4. FIG. 1 is a schematic circuit diagram of a static random access memory (SRAM) cell structure according to a first embodiment of the present invention. FIG. 2 is a schematic top view diagram of the SRAM cell structure in this embodiment. FIG. 3 is a schematic cross-sectional diagram of a first transistor and a second transistor in the SRAM cell structure of this embodiment. FIG. 4 is a schematic cross-sectional diagram of a third transistor and a fourth transistor in the SRAM cell structure of this embodiment. The right half of FIG. 3 may be regarded as a cross-sectional diagram taken along a line A-A' in FIG. 2, and the left half of FIG. 3 may be regarded as a cross-sectional diagram taken along a line B-B' in FIG. 2, but not limited thereto. As shown in FIG. 1 and FIG. 2, an SRAM cell structure 101 is provided in this embodiment. The SRAM cell structure 101 includes a first inverter V1 and a second inverter V2. The first inverter V1 includes a first transistor T1 and a second transistor T2. The first transistor T1 includes a first source electrode SE1 and a first drain electrode DE1. The first source electrode SE1 is connected to a first voltage source S1, and the first drain electrode DE1 is connected to a first storage node N1. The second transistor T2 includes a second source electrode SE2 and a second drain electrode DE2. The second source electrode SE2 is connected to a second voltage source S2. The second drain electrode DE2 is connected to the first storage node N1. The first source electrode SE1 includes a first doped region D11 and a second doped region D12. The second doped region D12 is disposed in the first doped region D11, and a conductivity type of the second doped region D12 is complementary to a conductivity type of the first doped region D11.

Specifically, as shown in FIGS. 1-3, in some embodiments, the SRAM cell structure 101 may be disposed on a substrate 10. A buried insulation layer 11 may be disposed on the substrate 10, and a semiconductor layer 30 may be disposed on the buried insulation layer 11. In some embodiments, the buried insulation layer 11 may include a buried oxide insulation layer or other suitable insulation materials, the semiconductor layer 30 may include a silicon-containing semiconductor layer or other suitable semiconductor materials, and the substrate 10, the buried insulation layer 11, and the semiconductor layer 30 may be regarded as a silicon on insulator (SOI) substrate accordingly, but not limited thereto. In addition, an isolation structure 20 may be disposed in the buried insulation layer 11 for dividing the semiconductor layer 30 into a plurality of active regions (such as a first active region 31, a second active region 32, a third active region 33, and a fourth active region 34 shown in FIG. 2, but not limited thereto). The isolation structure 20 may include a single layer or multiple layers of insulation materials, such as an oxide insulation material and an oxynitride insulation material, but not limited thereto.

In some embodiments, the first transistor T1 may further include a first gate electrode GE1, a gate dielectric layer 40, and a first body region B1. The first body region B1 may be disposed under the first gate electrode GE1 and disposed between the first source electrode SE1 and the first drain electrode DE1. The gate dielectric layer 40 may be disposed between the first gate electrode GE1 and the first body region B1 in a thickness direction Z of the substrate 10. The first gate electrode GE1 may include a non-metallic gate electrode, such as a polysilicon gate electrode, a non-metallic gate electrode formed by other suitable conductive materials, or a metal gate electrode. The gate dielectric layer 40 may include an oxide layer, such as a silicon oxide layer, or other suitable dielectric materials, such as high dielectric constant dielectric materials. In some embodiments, the first drain electrode DE1 may include a first drain doped region D13, and the first body region B1, the first doped region D11, the second doped region D12, and the first drain doped region D13 may be formed by doping the semiconductor layer 30 with required dopants respectively, but not limited thereto. For example, when the first transistor T1 is an n-type field effect transistor (nFET), the first body region B1 may be a p-type body region, the first doped region D11 and the first drain doped region D13 may be n-type doped regions, and the second doped region D12 may be a p-type doped region. Relatively, when the first transistor T1 is a p-type field effect transistor (pFET), the first body region B1 may be an n-type body region, the first doped region D11 and the first drain doped region D13 may be p-type doped regions, and the second doped region D12 may be an n-type doped region. Therefore, a charge release path for the first body region B1 may be formed by disposing the first doped region D11 and the second doped region D12 having a conductivity type complementary to a conductivity type of the first doped region D11 in the first source electrode SE1 connected to the first voltage source S1. The negative impact of the floating body effect on the electrical performance and the reliability of the SRAM cell structure 101 may be avoided accordingly. In other words, an electrical connection path between the first body region B1 and the first voltage source S1 may be formed by the first source electrode SE1 including the first doped region D11 and the second doped region D12 having the conductivity type complementary to the conductivity type of the first doped region D11. Accumulated charge in the first body region B1 during the operation of the SRAM cell structure 101 may be released accordingly, and that is helpful to improve the electrical performance and/or the reliability of the SRAM cell structure 101.

In some embodiments, a part of the first doped region D11 may be disposed between the first body region B1 and the second doped region D12. In some embodiments, the second doped region D12 may divide the first doped region D11 into two separated parts disposed at two opposite sides of the second doped region D12 respectively, but not limited thereto. Therefore, in some embodiments, the first source electrode SE1 may include an NPN structure when the first doped region D11 is an n-type doped region and the second doped region D12 is a p-type doped region, but not limited thereto. In some embodiments, the first source electrode SE1 may include a PNP structure when the first doped region D11 is a p-type doped region and the second doped region D12 is an n-type doped region. Additionally, in some embodiments, when the semiconductor layer 30 is relatively thinner, the first doped region D11, the second doped region D12, and the first drain doped region D13 may directly contact the buried insulation layer 11 underneath respectively, but not limited thereto.

In some embodiments, the SRAM cell structure 101 may further include a first conductive layer 51A and a first drain conductive layer 51B. The first conductive layer 51A may be disposed on the first doped region D11 and the second doped region D12, and the first conductive layer 51A may be electrically connected with the first doped region D11 and the second doped region D12. The first drain conductive layer 51B may be disposed on the first drain doped region D13 and electrically connected with the first drain doped region D13. In some embodiments, the first conductive layer 51A and the first drain conductive layer 51B may be a silicide conductive material and may be formed by a self-aligned approach. Therefore, the first conductive layer 51A may directly contact the first doped region D11 and the second doped region D12, and the first drain conductive layer 51B may directly contact the first drain doped region D13, but not limited thereto. The silicide conductive material described above may include a metal silicide material, such as cobalt silicide, nickel silicide, or other suitable metal silicide. Additionally, contact structures 70 may be disposed on the first conductive layer 51A and the first drain conductive layer 51B correspondingly. The first source electrode SE1 and the first drain electrode DE1 may be electrically connected to the first voltage source S1 and the first storage node N1 respectively via the corresponding contact structures 70. The contact structure 70 may include a low electrical resistivity material and a barrier layer, but not limited thereto. The low electrical resistivity material described above may include a material having a relatively lower electrical resistivity, such as copper, aluminum, and tungsten, and the barrier layer described above may include titanium nitride, tantalum nitride, or other suitable barrier materials.

As shown in FIGS. 1-3, in some embodiments, the second transistor T2 may further include a second gate electrode GE2, the gate dielectric layer 40, and a second body region B2. The second body region B2 may be disposed under the second gate electrode GE2 and disposed between the second source electrode SE2 and the second drain electrode DE2, and the gate dielectric layer 40 may be disposed between the second gate electrode GE2 and the second body region B2 in the thickness direction Z of the substrate 10. The material of the second gate electrode GE2 may be similar to the material of the first gate electrode GE1 described above, but not limited thereto.

In some embodiments, the second source electrode SE2 of the second transistor T2 may include a third doped region D21 and a fourth doped region D22, and the second drain electrode DE2 may include a second drain doped region D23. The fourth doped region D22 is disposed in the third doped region D21, and a conductivity type of the fourth doped region D22 is complementary to a conductivity type of the third doped region D21. The second body region B2, the third doped region D21, the fourth doped region D22, and the second drain doped region D23 in the second transistor T2 may be formed by doping the semiconductor layer 30 with required dopants respectively, but not limited thereto. For example, when the second transistor T2 is a p-type field effect transistor, the second body region B2 may be an n-type body region, the third doped region D21 and the second drain doped region D23 may be p-type doped regions, and the fourth doped region D22 may be an n-type doped region. Relatively, when the second transistor T2 is an n-type field effect transistor, the second body region B2 may be a p-type body region, the third doped region D21 and the second drain doped region D23 may be n-type doped regions, and the fourth doped region D22 may be a p-type doped region. Therefore, a charge release path for the second body region B2 may be formed by disposing the third doped region D21 and the fourth doped region D22 having a conductivity type complementary to a conductivity type of the third doped region D21 in the second source electrode SE2 connected to the second voltage source S2. The negative impact of the floating body effect on the electrical performance and the reliability of the SRAM cell structure 101 may be avoided accordingly. In other words, an electrical connection path between the second body region B2 and the second voltage source S2 may be formed by the second source electrode SE2 including the third doped region D21 and the fourth doped region D22 having the conductivity type complementary to the conductivity type of the third doped region D21. Accumulated charge in the second body region B2 during the operation of the SRAM cell structure 101 may be released accordingly, and that is helpful to improve the electrical performance and/or the reliability of the SRAM cell structure 101 also.

It is worth noting that the first transistor T1 and the second transistor T2 in the first inverter V1 may be transistors of different types. For example, when the first voltage source S1 is ground voltage (Vss) and the second voltage source S2 is supply voltage (Vcc), the first transistor T1 may be regarded as a pull-down transistor which is an n-type field effect transistor, and the second transistor T2 may be regarded as a pull-up transistor which is a p-type field effect transistor. Therefore, in some embodiments, the conductivity type of the first doped region D11 may be identical to the conductivity type of the fourth doped region D22, and the conductivity type of the second doped region D12 may be identical to the conductivity type of the third doped region D21, but not limited thereto.

In some embodiments, a part of the third doped region D21 may be disposed between the second body region B2 and the fourth doped region D22. In some embodiments, the fourth doped region D22 may divide the third doped region D21 into two separated parts disposed at two opposite sides of the fourth doped region D22 respectively, but not limited thereto. Therefore, in some embodiments, the second source electrode SE2 may include a PNP structure when the third doped region D21 is a p-type doped region and the fourth doped region D22 is an n-type doped region, but not limited thereto. In some embodiments, the second source electrode SE2 may include an NPN structure when the third doped region D21 is an n-type doped region and the fourth doped region D22 is a p-type doped region. Additionally, in some embodiments, when the semiconductor layer 30 is relatively thinner, the third doped region D21, the fourth doped region D22, and the second drain doped region D23 may directly contact the buried insulation layer 11 underneath respectively, but not limited thereto.

In some embodiments, the SRAM cell structure 101 may further include a second conductive layer 52A and a second drain conductive layer 52B. The second conductive layer 52A may be disposed on the third doped region D21 and the fourth doped region D22, and the second conductive layer 52A may be electrically connected with the third doped region D21 and the fourth doped region D22. The second drain conductive layer 52B may be disposed on the second drain doped region D23 and electrically connected with the second drain doped region D23. In some embodiments, the material and the forming method of the second conductive layer 52A and the second drain conductive layer 52B may similar to those of the first conductive layer 51A and the first drain conductive layer 51B described above, but not limited thereto. Additionally, the second conductive layer 52A may directly contact the third doped region D21 and the fourth doped region D22, and the second drain conductive layer 52B may directly contact the second drain doped region D23, but not limited thereto. Corresponding contact structures 70 may be disposed on the second conductive layer 52A and the second drain conductive layer 52B respectively. The second source electrode SE2 and the second drain electrode DE2 may be electrically connected to the second voltage source S2 and the first storage node N1 respectively via the corresponding contact structures 70.

As shown in FIG. 1, in some embodiments, the SRAM cell structure 101 may further include a second inverter V2, and the second inverter V2 may include a third transistor T3 and a fourth transistor T4. The third transistor T3 includes a third gate electrode GE3, a third source electrode SE3, and a third drain electrode DE3, and the fourth transistor T4 includes a fourth gate electrode GE4, a fourth source electrode SE4, and a fourth drain electrode DE4. In some embodiments, the third source electrode SE3 of the third transistor T3 is connected to the first voltage source S1, the third drain electrode DE3 of the third transistor T3 is connected to a second storage node N2, the fourth source electrode SE4 of the fourth transistor T4 is connected to the second voltage source S2, and the fourth drain electrode DE4 of the fourth transistor T4 is connected to the second storage node N2. The third transistor T3 and the fourth transistor T4 in the second inverter V2 may be transistors of different types. For example, when the first voltage source S1 is ground voltage and the second voltage source S2 is supply voltage, the third transistor T3 may be regarded as a pull-down transistor which is an n-type field effect transistor, and the fourth transistor T4 may be regarded as a pull-up transistor which is a p-type field effect transistor, but not limited thereto. The first transistor T1, the second transistor T2, the third transistor T3, and the fourth transistor T4 may constitute a latch that stores data in the first storage node N1 or the second storage node N2. In addition, the SRAM cell structure 101 may further include a first passing gate transistor PG1 and a second passing gate transistor PG2. A gate electrode, a source electrode, and a drain electrode of the first passing gate transistor PG1 may be electrically connected to a word line WL, a first bit line BL1, and the first storage node N1 respectively. A gate electrode, a source electrode, and a drain electrode of the second passing gate transistor PG2 may be electrically connected to the word line WL, a second bit line BL2, and the second storage node N2 respectively. In some embodiments, the SRAM cell structure 101 may be regarded as a six-transistor SRAM (6T-SRAM) cell structure, but not limited thereto. In other embodiments, the first transistor T1, the second transistor T2, the third transistor T3, and the fourth transistor T4 described above may also be applied in other suitable SRAM cell structures.

As shown in FIGS. 1-4, in some embodiments, the third source electrode SE3 of the third transistor T3 may include a fifth doped region D31 and a sixth doped region D32, the third drain electrode DE3 may include a third drain doped region D33, the fourth source electrode SE4 of the fourth transistor T4 may include a seventh doped region D41 and an eighth doped region D42, and the fourth drain electrode DE4 may include a fourth drain doped region D43, but not limited thereto. The sixth doped region D32 is disposed in the fifth doped region D31, and a conductivity type of the sixth doped region D32 is complementary to a conductivity type of the fifth doped region D31. The eighth doped region D42 is disposed in the seventh doped region D41, and a conductivity type of the eighth doped region D42 is complementary to a conductivity type of the seventh doped region D41. For example, when the third transistor T3 is an n-type field effect transistor and the fourth transistor T4 is a p-type field effect transistor, a third body region B3 of the third transistor T3 may be a p-type body region, a fourth body region B4 of the fourth transistor T4 may be an n-type body region. The fifth doped region D31, the third drain doped region D33, and the eighth doped region D42 may be n-type doped regions, and the sixth doped region D32, the fourth drain doped region D43, and the seventh doped region D41 may be p-type doped regions, but not limited thereto.

In some embodiments, the SRAM cell structure 101 may further include a third conductive layer 53A, a third drain conductive layer 53B, a fourth conductive layer 54A, and a fourth drain conductive layer 54B. The third conductive layer 53A may be disposed on the fifth doped region D31 and the sixth doped region D32, and the third conductive layer 53A is electrically connected with the fifth doped region D31 and the sixth doped region D32. The third drain doped region 53B may be disposed on the third drain doped region D33 and electrically connected with the third drain doped region D33. The fourth conductive layer 54A may be disposed on the seventh doped region D41 and the eighth doped region D42, and the e fourth conductive layer 54A is electrically connected with the seventh doped region D41 and the eighth doped region D42. The fourth drain conductive layer 54B may be disposed on the fourth drain doped region D43 and electrically connected with the fourth drain doped region D43. In some embodiments, the third conductive layer 53A, the materials and the forming method of the third drain conductive layer 53B, the fourth conductive layer 54, and the fourth drain conductive layer 54B may be similar to those of the first conductive layer 51A and the first drain conductive layer 51B in the first embodiment described above, but not limited thereto. In some embodiments, the cross-sectional structure of the third transistor T3 may be similar to that of the first transistor T1, and the cross-sectional structure of the fourth transistor T4 may be similar to that of the second transistor T2.

As shown in FIGS. 1-4, in some embodiments, the first gate electrode GE1 and the second gate electrode GE2 may be integrated in one gate line (e.g. a first gate line 61 shown in FIG. 2); the gate electrode of the first passing gate transistor PG1 may be a second gate line 62; the third gate electrode GE3 and the fourth gate electrode GE4 may be integrated in one gate line (e.g. a third gate line 63 shown in FIG. 2); and the gate electrode of the second passing gate transistor PG2 may be a fourth gate line 64, but not limited thereto. Additionally, in some embodiments, two doped regions having complementary conductivity types may be disposed in each of the source electrodes of the two pull-down transistors (such as the first transistor T1 and the third transistor T3) and the two pull-up transistors (such as the second transistor T2 and the fourth transistor T4) in the SRAM cell structure 101 for forming charge release paths for the body regions, and the source regions of the first passing gate transistor PG1 and the second passing gate transistor PG2 may have a doped region with only single conductivity type respectively, but not limited thereto. In some embodiments, two doped regions having complementary conductivity types may be disposed in each of the source electrodes of the pull-down transistors only or may be disposed in each of the source electrodes of the pull-up transistors only.

Figure 5:
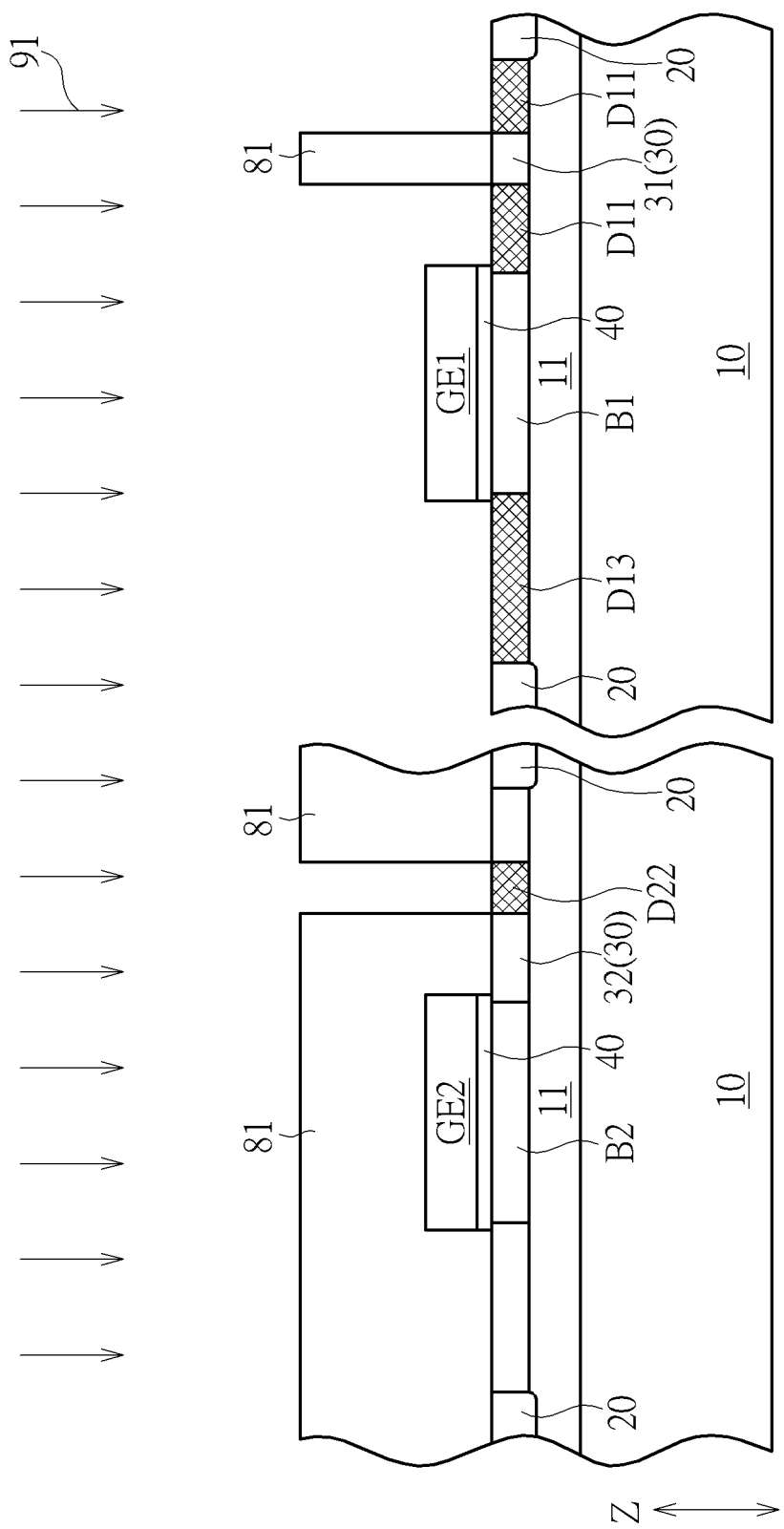
Figure 6:
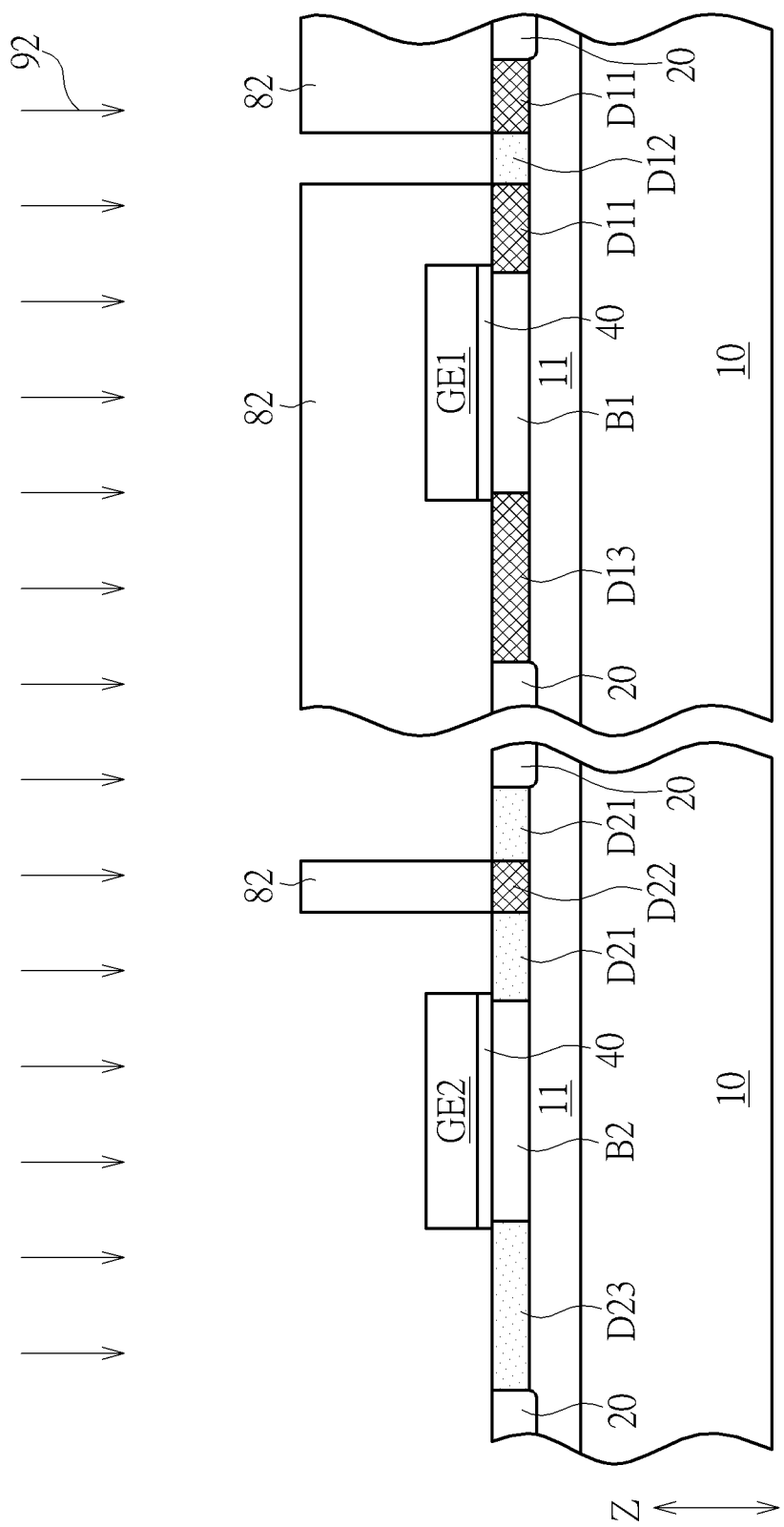

Please refer to FIG. 5, FIG. 6, and FIG. 3. FIG. 5 and FIG. 6 are schematic drawings illustrating a manufacturing method of the SRAM cell structure in this embodiment, wherein FIG. 6 is a schematic drawing in a step subsequent to FIG. 5, and FIG. 3 may be regarded as a schematic drawing in a step subsequent to FIG. 6. As shown in FIG. 5, FIG. 6, and FIG. 3, in some embodiments, the first doped region D11 and the first drain doped region D13 described above may be formed in the first active region 31 by forming a first patterned mask layer 81 and performing a first doping process 91 using the first patterned mask layer 81 as a mask, and the fourth doped region D22 described above may be formed in the second active region 32 by the first doping process 91. Subsequently, the first patterned mask layer 81 may be removed and a second patterned mask layer 82 may be formed. A second doping process 92 may be performed using the second patterned mask layer 82 as a mask for forming the second doped region D12, the third doped region D21, and the second drain doped region D23 described above. In some embodiments, the first doping process 91 and the second doping process 92 may include ion implantation processes using dopants having different conductivity types respectively. For example, when the first doped region D11, the first drain doped region D13, and the fourth doped region D22 are n-type doped regions and the second doped region D12, the third doped region D21, and the second drain doped region 23 are p-type doped regions, the dopant used in the first doping process 91 may include phosphorous or other suitable n-type dopants, and the dopant used in the second doping process 92 may include boron or other suitable p-type dopants, but not limited thereto. Additionally, in some embodiments, the second doping process 92 may be performed first, and the first doping process 91 may be performed after the second doping process 91. In addition, the fifth doped region D31, the sixth doped region D32, the third drain doped region D33, the seventh doped region D41, the eighth doped region D42, and the fourth drain doped region D43 described above in FIG. 4 may also be formed by the manufacturing method described above, but not limited thereto.

In this embodiment, the two doped regions having complementary conductivity types may be formed in the specific source region by adjusting the coverage of the patterned mask layers used in the originally required doping processes. The electrical performance and the reliability of the SRAM cell structure may be improved without increasing the process complexity and extra area.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
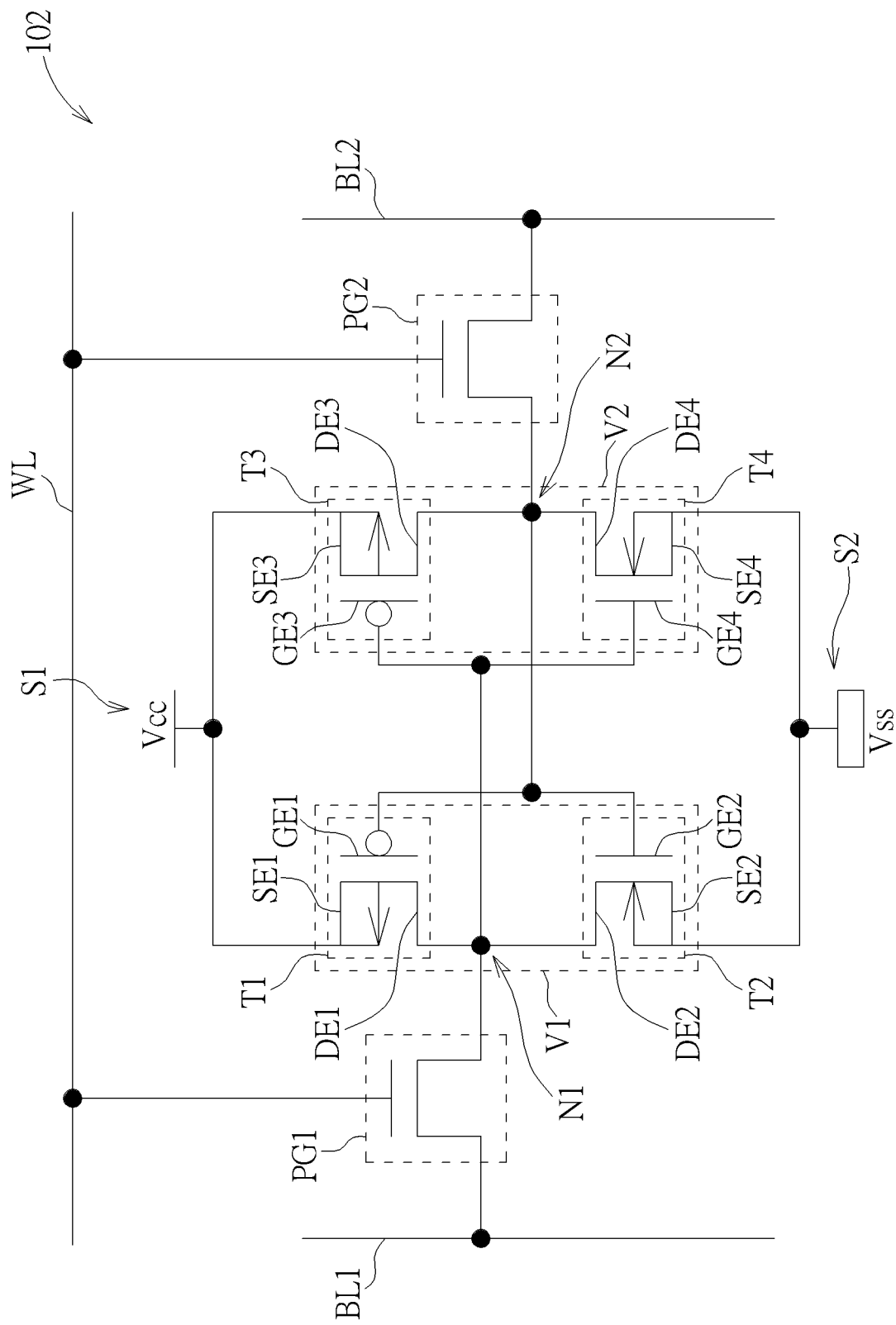
FIG. 7 is a schematic circuit diagram of an SRAM cell structure according to a second embodiment of the present invention.

Please refer to FIG. 7. FIG. 7 is a schematic circuit diagram of an SRAM cell structure 102 according to a second embodiment of the present invention. As shown in FIG. 7, the difference between the SRAM cell structure 102 and the SRAM cell structure in the first embodiment described above is that, in this embodiment, the first voltage source S1 may be supply voltage, and the second voltage source S2 may be ground voltage. Therefore, the first transistor T1 and the third transistor T3 may be pull-up transistors, and the second transistor T2 and the fourth transistor T4 may be pull-down transistors. Under the circuit design described above, the first transistor T1 and the third transistor T3 may be p-type filed effect transistors preferably, and the second transistor T2 and the fourth transistor T4 may be n-type field effect transistors preferably, but not limited thereto.

Figure 8:
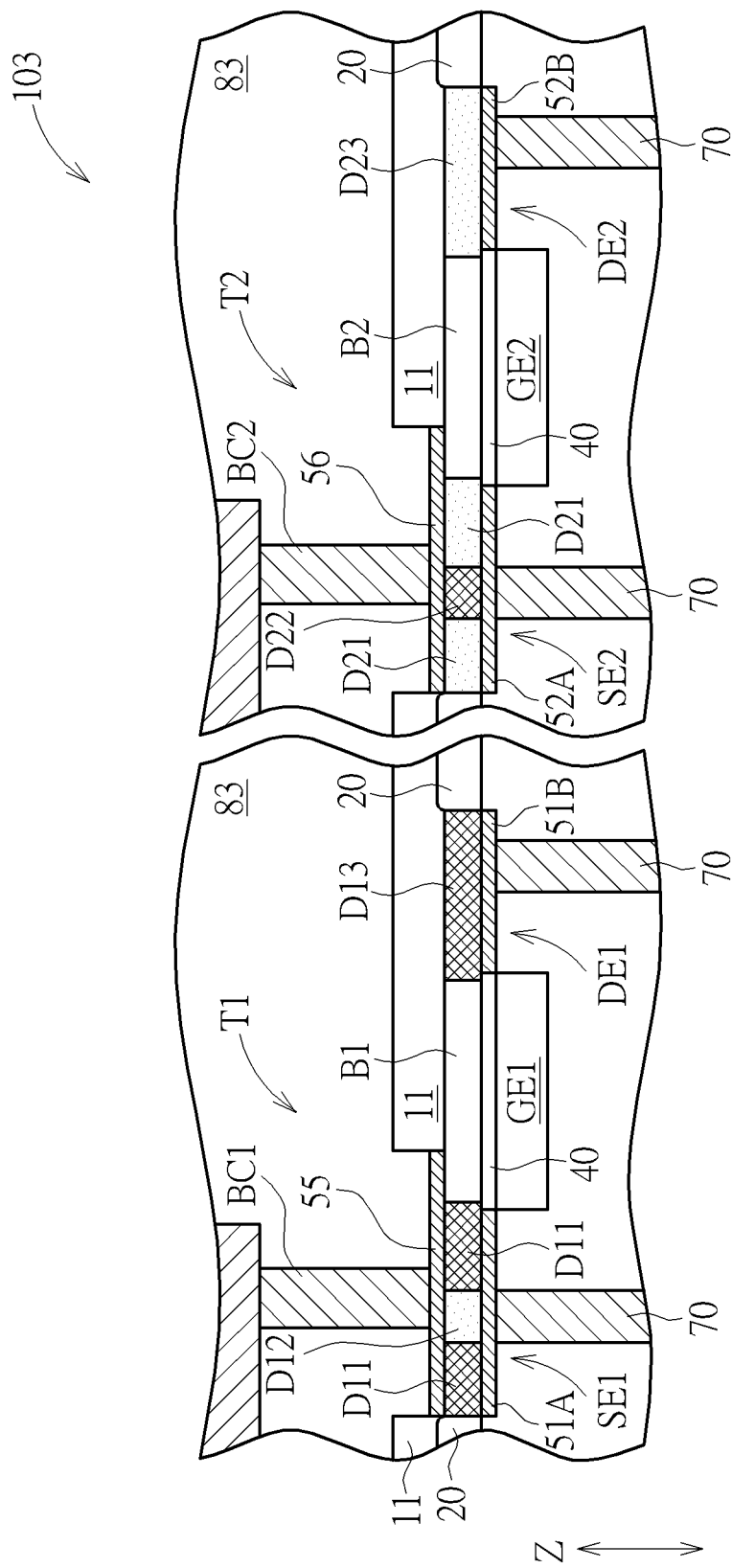
FIG. 8 is a schematic cross-sectional diagram of a first transistor and a second transistor in an SRAM cell structure according to a third embodiment of the present invention.

Please refer to FIG. 8. FIG. 8 is a schematic cross-sectional diagram of the first transistor T1 and the second transistor T2 in an SRAM cell structure 103 according to a third embodiment of the present invention. As shown in FIG. 8, the difference between the SRAM cell structure 103 and the SRAM cell structure in the first embodiment described above is that, the SRAM cell structure 103 may further include a first back side conductive layer 55 and a second back side conductive layer 56. The first back side conductive layer 55 may be disposed on the first body region B1, the first doped region D11, and the second doped region D12, and the first back side conductive layer 55 may be electrically connected with the first body region B1, the first doped region D11, and the second doped region D12. The second back side conductive layer 56 may be disposed on the second body region B2, the third doped region D21, and the fourth doped region D22, and the second back side conductive layer 56 may be electrically connected with the second body region B2, the third doped region D21, and the fourth doped region D22. In some embodiments, the first back side conductive layer 55 and the first conductive layer 51A may be disposed at two opposite sides of the first source electrode SE1 in the thickness direction Z respectively, and the second back side conductive layer 56 and the second conductive layer 52A may be disposed at two opposite sides of the second source electrode SE2 in the thickness direction Z respectively.

Specifically, in some embodiments, the substrate in the first embodiment described above may be removed. After removing the substrate, an opening may be formed in the buried insulation layer 11 for exposing the first source electrode SE1 and a part of the first body region B1, and another opening may be formed in the buried insulation layer 11 for exposing the second source electrode SE2 and a part of the second body region B2. Subsequently, the first back side conductive layer 55 and the second back side conductive layer 56 may be formed in the openings described above respectively. In some embodiments, the first back side conductive layer 55 and the second back side conductive layer 56 may be conductive silicide materials and may be formed by a self-aligned approach, but not limited thereto. A dielectric layer 83 may then be formed covering the first back side conductive layer 55, the second back side conductive layer 56, and the buried insulation layer 11. A first back side contact BC1 and a second back side contact BC2 may be formed in the dielectric layer 83 and may be formed corresponding to the first back side conductive layer 55 and the second back side conductive layer 56 respectively. The dielectric layer 83 may include silicon oxide, silicon nitride, silicon oxynitride, or other suitable dielectric materials. The materials of the first back side contact structure BC1 and the second back side contact structure BC2 may be similar to the material of the contact structure 70, but not limited thereto. In some embodiments, the first body region B1 and the first source electrode SE1 may be electrically connected to the first voltage source described above via the first back side conductive layer 55 and the first back side contact structure BC1, and the second body region B2 and the second source electrode SE2 may be electrically connected to the second voltage source described above via the second back side conductive layer 56 and the second back side contact structure BC2, but not limited thereto. Additionally, in some embodiments, the back side conductive layers and the back side contact structures described above may also be applied to the third transistor and the fourth transistor of the first embodiment described above.

To summarize the above descriptions, in the SRAM cell structure of the present invention, two doped regions having complementary conductivity types may be disposed in the source electrode of the pull-up transistor and/or the source electrode of the pull-down transistor for forming the charge release path of the body region. The floating body effect in the SRAM cell structure of the present invention may be improved without increasing the occupied area, and the electrical performance and the reliability of the SRAM cell structure may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) cell structure, comprising:
   a first inverter, comprising:
     a first transistor, comprising:
       a first source electrode connected to a first voltage source, wherein the first source electrode comprises a first doped region and a second doped region disposed in the first doped region, and a conductivity type of the second doped region is complementary to a conductivity type of the first doped region; and
       a first drain electrode connected to a first storage node; and
     a second transistor, comprising:
       a second source electrode connected to a second voltage source; and
       a second drain electrode connected to the first storage node.

2. The SRAM cell structure according to claim 1, further comprising:
   a first conductive layer disposed on the first doped region and the second doped region, wherein the first conductive layer is electrically connected with the first doped region and the second doped region.

3. The SRAM cell structure according to claim 1, wherein the first transistor further comprises:
   a first gate electrode; and
   a first body region disposed under the first gate electrode and disposed between the first source electrode and the first drain electrode, wherein a part of the first doped region is disposed between the first body region and the second doped region.

4. The SRAM cell structure according to claim 3, further comprising:
   a first back side conductive layer disposed on the first body region, the first doped region, and the second doped region, wherein the first back side conductive layer is electrically connected with the first body region, the first doped region, and the second doped region.

5. The SRAM cell structure according to claim 1, wherein the second source electrode comprises a third doped region and a fourth doped region disposed in the third doped region, and a conductivity type of the fourth doped region is complementary to a conductivity type of the third doped region.

6. The SRAM cell structure according to claim 5, wherein the conductivity type of the first doped region is identical to the conductivity type of the fourth doped region, and the conductivity type of the second doped region is identical to the conductivity type of the third doped region.

7. The SRAM cell structure according to claim 5, further comprising:
   a second conductive layer disposed on the third doped region and the fourth doped region, wherein the second conductive layer is electrically connected with the third doped region and the fourth doped region.

8. The SRAM cell structure according to claim 5, wherein the second transistor further comprises:
   a second gate electrode; and
   a second body region disposed under the second gate electrode and disposed between the second source electrode and the second drain electrode, wherein a part of the third doped region is disposed between the second body region and the fourth doped region.

9. The SRAM cell structure according to claim 8, further comprising:
   a second back side conductive layer disposed on the second body region, the third doped region, and the fourth doped region, wherein the second back side conductive layer is electrically connected with the second body region, the third doped region, and the fourth doped region.

10. The SRAM cell structure according to claim 1, wherein the first voltage source is ground voltage, the second voltage source is supply voltage, the first transistor is a pull-down transistor, and the second transistor is a pull-up transistor.

11. The SRAM cell structure according to claim 1, wherein the first voltage source is supply voltage, the second voltage source is ground voltage, the first transistor is a pull-up transistor, and the second transistor is a pull-down transistor.

12. The SRAM cell structure according to claim 1, further comprising:
   a second inverter, comprising:
     a third transistor, comprising:
       a third source electrode connected to the first voltage source, wherein the third source electrode comprises a fifth doped region and a sixth doped region disposed in the fifth doped region, and a conductivity type of the sixth doped region is complementary to a conductivity type of the fifth doped region; and
       a third drain electrode connected to a second storage node; and
     a fourth transistor, comprising:
       a fourth source electrode connected to the second voltage source; and
       a fourth drain electrode connected to the second storage node.

13. The SRAM cell structure according to claim 12, wherein the fourth source electrode comprises a seventh doped region and an eighth doped region disposed in the seventh doped region, and a conductivity type of the eighth doped region is complementary to a conductivity type of the seventh doped region.

14. A static random access memory (SRAM) cell structure, comprising:
   a first inverter, comprising:
     a first transistor, comprising:
       a first source electrode connected to a first voltage source, wherein the first source electrode comprises a first doped region and a second doped region disposed in the first doped region, and a conductivity type of the second doped region is complementary to a conductivity type of the first doped region, wherein the second doped region divides the first doped region into two separated parts disposed at two opposite sides of the second doped region respectively; and a first drain electrode connected to a first storage node; and a second transistor, comprising:

a second source electrode connected to a second voltage source; and a second drain electrode connected to the first storage node.

15. The SRAM cell structure according to claim 14, further comprising:

a first conductive layer disposed on the first doped region and the second doped region, wherein the first conductive layer is electrically connected with the first doped region and the second doped region.

16. The SRAM cell structure according to claim 14, wherein the second source electrode comprises a third doped region and a fourth doped region disposed in the third doped region, and a conductivity type of the fourth doped region is complementary to a conductivity type of the third doped region.

17. The SRAM cell structure according to claim 16, wherein the conductivity type of the first doped region is identical to the conductivity type of the fourth doped region, and the conductivity type of the second doped region is identical to the conductivity type of the third doped region.

18. The SRAM cell structure according to claim 16, further comprising:

a second conductive layer disposed on the third doped region and the fourth doped region, wherein the second conductive layer is electrically connected with the third doped region and the fourth doped region.

19. The SRAM cell structure according to claim 16, wherein the fourth doped region divides the third doped region into two separated parts disposed at two opposite sides of the fourth doped region respectively.

20. The SRAM cell structure according to claim 14, further comprising:

a second inverter, comprising:

a third transistor, comprising:

a third source electrode connected to the first voltage source, wherein the third source electrode comprises a fifth doped region and a sixth doped region disposed in the fifth doped region, and a conductivity type of the sixth doped region is complementary to a conductivity type of the fifth doped region; and a third drain electrode connected to a second storage node; and a fourth transistor, comprising:

a fourth source electrode connected to the second voltage source, wherein the fourth source electrode comprises a seventh doped region and an eighth doped region disposed in the seventh doped region, and a conductivity type of the eighth doped region is complementary to a conductivity type of the seventh doped region; and a fourth drain electrode connected to the second storage node.

* * * * *